United States Patent
Perminjat et al.

(12)

(10) Patent No.: US 10,996,412 B2
(45) Date of Patent: May 4, 2021

(54) ELECTRONIC DEVICE COMPRISING AN ELECTRONIC CHIP PROVIDED WITH AN OPTICAL CABLE

(71) Applicant: STMicroelectronics (Grenoble 2) SAS, Grenoble (FR)

(72) Inventors: Florian Perminjat, Saint Romans (FR); Romain Coffy, Voiron (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/701,355

(22) Filed: Dec. 3, 2019

(65) Prior Publication Data

US 2020/0174206 A1 Jun. 4, 2020

(30) Foreign Application Priority Data

Dec. 4, 2018 (FR) ........................................ 1872280

(51) Int. Cl.
*G02B 6/43* (2006.01)
*H05K 1/02* (2006.01)
*G02B 6/12* (2006.01)
*G02B 6/42* (2006.01)

(52) U.S. Cl.
CPC ............. *G02B 6/43* (2013.01); *H05K 1/0274* (2013.01)

(58) Field of Classification Search
CPC .... G02B 6/43; G02B 6/12004; G02B 6/4274; G02B 6/428; H05K 1/0274
See application file for complete search history.

(56) References Cited

U.S. PATENT DOCUMENTS

| 6,955,481 B2 * | 10/2005 | Colgan ................ G02B 6/4214 385/14 |
| 7,344,383 B1 * | 3/2008 | Lu ........................ G02B 6/4284 439/71 |
| 7,373,033 B2 * | 5/2008 | Lu .......................... G02B 6/421 257/432 |
| 7,394,665 B2 * | 7/2008 | Hamasaki ................ G02B 6/43 361/803 |

(Continued)

FOREIGN PATENT DOCUMENTS

WO 2013100995 A1 7/2013

OTHER PUBLICATIONS

INPI Search Report and Written Opinion for FR 1872280 dated Sep. 23, 2019 (9 pages).

*Primary Examiner* — Ryan A Lepisto
(74) *Attorney, Agent, or Firm* — Crowe & Dunlevy

(57) ABSTRACT

A carrier substrate includes a first network of electrical connections and recess. An electronic chip is mounted to the carrier substrate within the recess. The electronic chip includes an integrated guide of optical waves and a second network of electrical connections. A end section of an elongate optical cable is mounted on one side of the electronic chip with a longitudinal guide of optical waves optically coupled to the integrated guide of optical waves. Electrical connection elements are interposed between a face of the electronic chip and a bottom wall of the recess, such that first connect pads of the first electrical connection network are connected to second connect pads of the second electrical connection network through the electrical connection elements.

26 Claims, 3 Drawing Sheets

(56) References Cited

U.S. PATENT DOCUMENTS

| | | | | |
|---|---|---|---|---|
| 8,188,594 | B2* | 5/2012 | Ganesan | H01L 23/367 257/713 |
| 8,867,231 | B2* | 10/2014 | Roitberg | H01L 23/50 361/803 |
| 8,971,676 | B1* | 3/2015 | Thacker | G02B 6/12 385/14 |
| 9,250,403 | B2* | 2/2016 | Thacker | G02B 6/4274 |
| 9,297,971 | B2* | 3/2016 | Thacker | H01L 25/0655 |
| 9,391,708 | B2* | 7/2016 | Fincato | H04B 10/801 |
| 9,470,855 | B1* | 10/2016 | Shubin | G02B 6/43 |
| 9,496,248 | B2* | 11/2016 | Lee | H01L 23/473 |
| 9,500,821 | B2* | 11/2016 | Hochberg | G02B 6/423 |
| 9,612,405 | B2* | 4/2017 | Aoki | G02B 6/381 |
| 9,671,572 | B2* | 6/2017 | Decker | G02B 6/4204 |
| 9,678,271 | B2* | 6/2017 | Thacker | G02B 6/12004 |
| 9,847,271 | B2* | 12/2017 | Miura | H01L 23/3677 |
| 9,874,688 | B2* | 1/2018 | Doerr | G02B 6/428 |
| 10,012,792 | B2* | 7/2018 | Carpentier | G02B 6/428 |
| 10,025,047 | B1* | 7/2018 | Liu | H05K 1/11 |
| 2006/0050493 | A1* | 3/2006 | Hamasaki | G02B 6/428 361/767 |
| 2012/0207426 | A1* | 8/2012 | Doany | G02B 6/426 385/14 |
| 2013/0322813 | A1 | 12/2013 | Grondin et al. | |
| 2014/0112616 | A1 | 4/2014 | Numata | |
| 2014/0203175 | A1* | 7/2014 | Kobrinsky | H01L 24/83 250/214.1 |
| 2016/0205778 | A1 | 7/2016 | Lin et al. | |
| 2016/0377823 | A1* | 12/2016 | Garland | G02B 6/4271 385/14 |
| 2020/0116930 | A1* | 4/2020 | Kannan | G02B 6/13 |

* cited by examiner

ELECTRONIC DEVICE COMPRISING AN ELECTRONIC CHIP PROVIDED WITH AN OPTICAL CABLE

PRIORITY CLAIM

This application claims the priority benefit of French Application for Patent No. 1872280, filed on Dec. 4, 2018, the content of which is hereby incorporated by reference in its entirety to the maximum extent allowable by law.

TECHNICAL FIELD

Embodiments of the present invention relate to the field of electronic devices comprising an electronic chip to which an optical cable is mounted.

BACKGROUND

It is known in the art to have a system which includes an integrated circuit chip that is configured to handle optical signals. It is also known in the art for optical signals to be transmitted over an optical cable. An interface is needed at the integrated circuit chip to couple to an end of the optical cable. There is a need at the point of the interface to securely mount the optical cable to the integrated circuit chip. There is further a need for configuring the mounting of the integrated circuit chip to a carrier substrate in a manner which supports the coupling of the optical cable.

SUMMARY

According to one embodiment, an electronic device comprises: a carrier substrate including a network of electrical connections, an electronic chip including at least one integrated guide of optical waves and one network of electrical connections, and an elongate optical cable having an end section mounted flat on one side of the chip and including at least one guide of optical waves that is optically coupled to the guide of optical waves of the chip.

The carrier substrate has a recess in which the chip is at least partially engaged.

The electrical connection elements are interposed between a face of the chip and a bottom wall of the recess and connect pads of the electrical connection network of the chip and pads of the electrical connection network of the carrier substrate.

Thus, the electrical connections included in the carrier substrate are short and the bulk of the electronic device is decreased.

The carrier substrate may be configured to let the optical cable pass.

The recess may be configured to let the optical cable pass.

That face of the carrier substrate which is located on the side opposite to the recess may be provided with exterior pads of the electrical connection network of the carrier substrate.

That face of the carrier substrate which is located on the side of the recess may be provided with exterior pads of the electrical connection network of the carrier substrate.

The carrier substrate may have at least one through passage and/or at least one channel in the bottom of the recess.

The carrier substrate may comprise two portions, a first portion of which may be formed by a plate that has a median zone corresponding to the bottom wall of the recess and an exterior zone adjacent to this median zone and a second portion which is adhesively bonded to the exterior zone of the first portion to form the lateral walls of the recess.

The first portion of the carrier substrate may be provided with the electrical connection network of this carrier substrate.

The two portions of the carrier substrate may be provided with two connected-together portions of the electrical connection network of this carrier substrate.

The chip may comprise a base wafer including said integrated guide of optical waves and a front layer including the electrical connection network of this chip. The front layer may have a local groove in which an end portion of the optical cable is at least partially engaged flat, in a position such that the guide of optical waves of the optical cable is optically coupled to the guide of optical waves of the chip, via a lateral coupling in the zone of said local groove.

The optical cable may be located on the side of the bottom wall of the carrier substrate with respect to the chip, the face of the front layer opposite to the base wafer being provided with said pads of the electrical connection network of the chip.

The optical cable may be located on the side opposite to the bottom wall of the carrier substrate with respect to the chip, the face of the base wafer opposite the front layer being provided with said pads of the electrical connection network of the chip.

An additional chip may be mounted on the front layer of the chip and connected to the electrical connection network of the chip.

The carrier substrate may be configured to receive the additional chip.

The carrier substrate may be mounted on a printed circuit board, the electrical connection network of the carrier substrate being connected to an electrical connection network of the printed circuit board.

BRIEF DESCRIPTION OF THE DRAWINGS

Electronic devices will now be described by way of non-limiting exemplary embodiments, which are illustrated by the appended drawings, in which.

DETAILED DESCRIPTION

Figure 1:
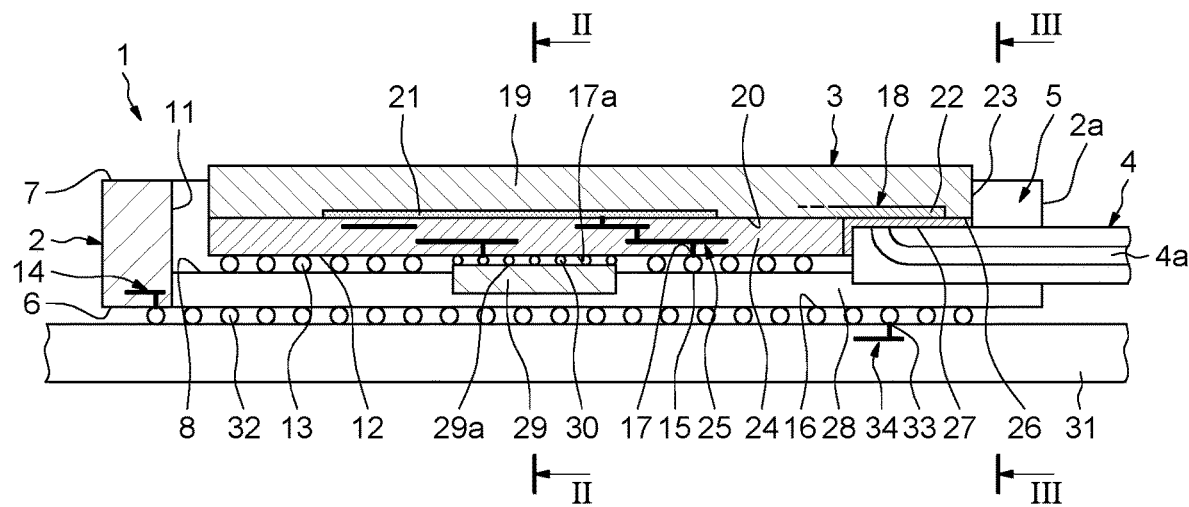
FIG. 1 shows a longitudinal cross section of an electronic device.
Figure 2:
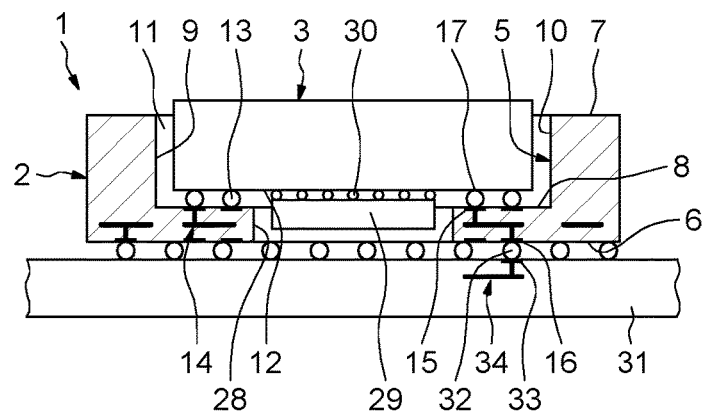
FIG. 2 shows a transverse cross section of the electronic device of FIG. 1, cut along line II-II.
Figure 3:
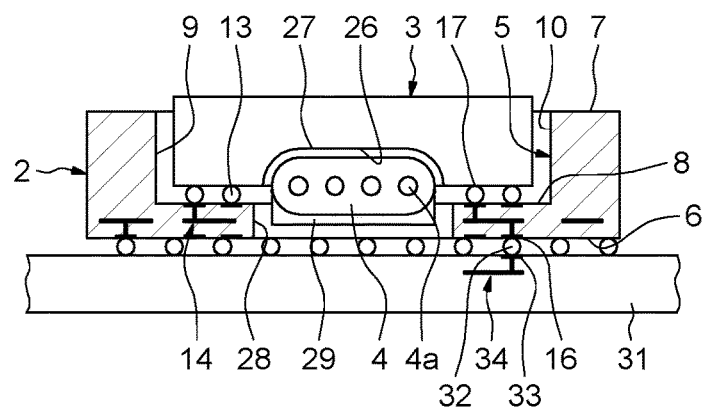
FIG. 3 shows another transverse cross section of the electronic device of FIG. 1, cut along line III-III.

The electronic device 1 illustrated in FIGS. 1 to 3 comprises a carrier substrate 2, taking the form of a plate, an electronic chip 3 that is mounted on the carrier substrate 2 and an elongate optical cable 4 that is mounted on the chip 3.

The carrier substrate 2 has a recess 5 in which the chip 3 is at least partially freely engaged.

The carrier substrate 2 has opposite faces 6 and 7. The recess 5 is formed from the face 7 and has a bottom wall 8, parallel to the faces 6 and 7, and opposite lateral walls 9 and 10 that extend in a longitudinal direction.

Advantageously, the recess 5 has a transverse end wall 11 and is open facing this end wall 11, on a transverse side 2a of the carrier substrate 2.

A face 12 of the chip 3 is located facing the bottom wall 8 of the recess 5 of the carrier substrate 2.

Electrical connection elements 13 are interposed between the face 12 of the chip 3 and the bottom wall 8 of the carrier substrate 2.

The carrier substrate 2 is provided with an integrated network 14 of electrical connections (FIG. 2) that is connected to the electrical connection elements 13. To this end, the integrated network 14 of electrical connections comprises electrical connection pads 15 produced in the bottom wall 8, on which pads are placed the electrical connection elements 13.

The network 14 of electrical connections comprises exterior electrical connection pads 16 produced in face 6 of the carrier substrate 2.

The recess 5, the bottom wall 8 of which is provided with the pads 15, and face 6 provided with the pads 16 are therefore located on opposite sides of the carrier substrate 2.

Because of the existence of the recess 5, the thickness of the carrier substrate 2 between face 6 and the bottom wall 8 is small, so that the electrical connections of the network 14 of electrical connections connecting the pads 15 of the bottom wall 8 of the recess 5 and the pads 16 of face 6, are short. Furthermore, the recess 5 allows the thickness of the electronic device 1 and therefore its bulk to be decreased.

Face 12 of the chip 3 is provided with front electrical connection pads 17 on which are placed the electrical connection elements 13.

The chip 3 includes at least one integrated guide 18 of optical or light waves, and the elongate optical cable 4 has an end portion mounted flat on one side of the chip 3 and includes at least one longitudinal guide 4a of optical or light waves that is optically coupled to the guide 18 of optical waves of the chip 3.

The carrier substrate 2 and in particular the recess 5 are configured to let the optical cable 4 pass.

As illustrated in FIG. 1, the chip 3 comprises a base wafer 19 (for example made of silicon) provided, on the side of a front face 20, with integrated electronic components 21 and with the integrated guide 18 of optical or light waves.

The guide 18 of optical waves has an advantageously rectilinear end section 22, which is adjacent to the front face 20. This end section 22 is advantageously located in a zone close to the side 23 of the chip 3 and for example extends perpendicular to this side 23, in the aforementioned longitudinal direction.

The chip 3 comprises a front layer 24 that is formed on the front face 20 of the base wafer 19 and the front face of which forms the aforementioned face 12 of the chip 3, so that the front layer 24 of the chip 3 is located on the side of the bottom wall 8 of the carrier substrate 2.

The front layer 24 of the chip 3 is provided with an integrated network 25 of electrical connections connecting the electronic components 21 to the pads 17 of face 12 of the chip 3.

The guide 18 of optical waves is connected to at least certain of the electronic components 21 so that signals transported by entering optical waves are converted into electrical signals and/or electrical signals issued from at least certain of the electronic components 21 are converted into optical signals transported by exiting optical waves.

In the front layer 24 of the chip 3 is produced, from face 12 of the chip 3, a local groove 26 that is located above the zone in which the end section 22 of the guide 18 of optical waves is located and which extends from the lateral side 23 of the chip 3, opposite to the end wall 11 of the recess 5 of the carrier substrate 2.

The local groove 26 extends depthwise to face 20 of the base wafer 19 and extends, in the aforementioned longitudinal direction, parallel to face 20 of the base wafer 19.

An end portion of the optical cable 4 is engaged longitudinally in the local groove 26 and is fastened in this local groove 26 by way of an adhesive layer 27 made of a material able to be passed through by the optical waves.

The guide 4a of optical waves of the optical cable 4 is optically coupled to the end section 22 of the guide 18 of optical waves of the chip 3, via a lateral coupling in the zone of the local groove 26.

The carrier substrate 2 has a space-making local longitudinal through-passage (channel) 28 produced in the middle of the recess 5, the bottom wall 8 having two portions located on either side of this through-passage 28 and the pads 15 are located on these two portions. The longitudinal through-passage 28 extends from the transverse end 11 of the recess 5 and as far as to the transverse wall 2a of the carrier substrate 2 where it is open.

The end portion of the optical cable 4 is engaged, laterally, partially in the local groove 26 of the chip 3.

On account of the small distance between face 12 of the chip 3 and the bottom wall 8 of the recess 5 of the carrier substrate 2, the end portion of the optical cable 4 is laterally engaged, partially and freely (FIG. 3), in the through-passage 28 of the carrier substrate 2, the optical cable 4 continuing, outside of the carrier substrate 2, away from the end wall 11 of the recess 5.

According to one variant embodiment, the chip 3 includes a plurality of integrated guides 18 of optical waves, having parallel and neighboring end sections 22 that are connected to the electronic components 21.

As illustrated in FIG. 3, the optical cable 4 includes a plurality of guides 4a of optical waves that are placed in parallel with each other in the form of a ribbon. The end portion of the optical cable 4 is engaged flat in a corresponding groove 26. The guides 4a of optical waves of the optical cable 4 are respectively optically coupled to the guides 18 of optical waves of the chip 3, via lateral couplings.

The electronic device 1 further comprises an additional chip 29 that is mounted above face 12 of the chip 3 and that is freely engaged in the through-passage 28 of the carrier substrate 2. The additional chip 29 is connected to the electrical connection network 25 of the chip 3 by way of specific electrical connection elements 30 that are interposed between specific electrical connection pads 17a of face 12 of the chip 3 and electrical connection pads 29a of the additional chip 29.

According to one variant embodiment (not shown), instead of having a through-passage 28, the carrier substrate 2 could have a local space-making blind channel or two local space-making through- or blind channels produced from the bottom wall 8 of the recess 11, the chip 29 and the end of the optical cable 4 being freely engaged in this local channel or in these local channels, respectively.

The electronic device 1 is mounted on a printed circuit board 31 located on the side of face 6 of the carrier substrate 2, by way of electrical connection elements 32 placed between the exterior pads 16 of the electrical connection network 14 of the carrier substrate 2 and pads 33 of an electrical connection network 34 of the printed circuit board 31, or of direct connections.

Figure 4:
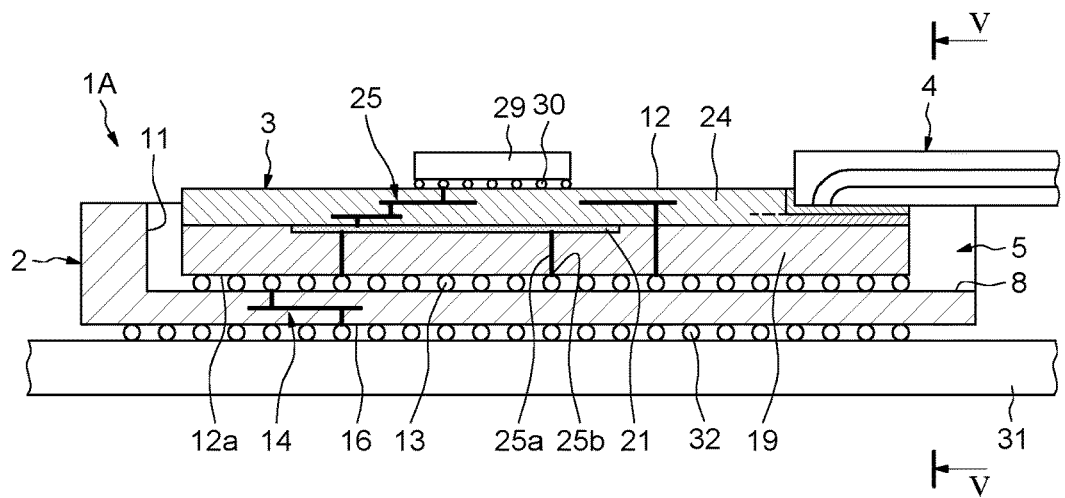
FIG. 4 shows a longitudinal cross section of another electronic device.
Figure 5:
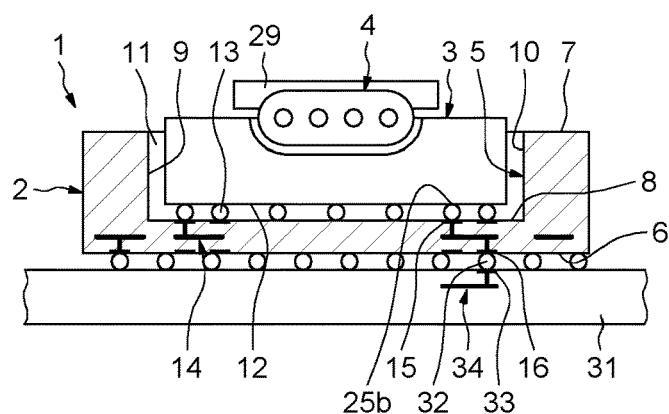
FIG. 5 shows a transverse cross section of the electronic device of FIG. 4, cut along line V-V.

FIGS. 4 and 5 illustrate an electronic device 1A that differs from the electronic device 1 of FIGS. 1-3 in the fact that the chip 3, equipped with the optical cable 4 and the additional chip 29, is mounted upside down on the carrier substrate 2 (relative to the implementation of FIGS. 1-3).

The base wafer 19 of the chip 3 is on the side of the bottom wall 8 of the recess 5 of the carrier substrate 2, face 12a of the chip 3, which is opposite face 12, lying facing the bottom wall 8 of the carrier substrate 2. The layer 24 of the chip 3 is on the exterior side of the recess 5 of the carrier substrate 2. The optical cable 4 and the additional chip 29 are opposite the bottom wall 8 of the recess 5 of the carrier substrate 2 with respect to the chip 3.

This time, the electronic components 21 and/or the electrical connection network 25 of the chip 3 are connected to the electrical connection elements 13 by way of through-vias 25A (TSVs) that are produced through the base wafer 19 and that comprise electrical connection pads 25b of the back face 12a of the chip 3.

Advantageously, the through-passage 28 of the carrier substrate 2 is not needed and may be removed, the bottom wall 8 of the recess 5 then being continuous.

Figure 6:
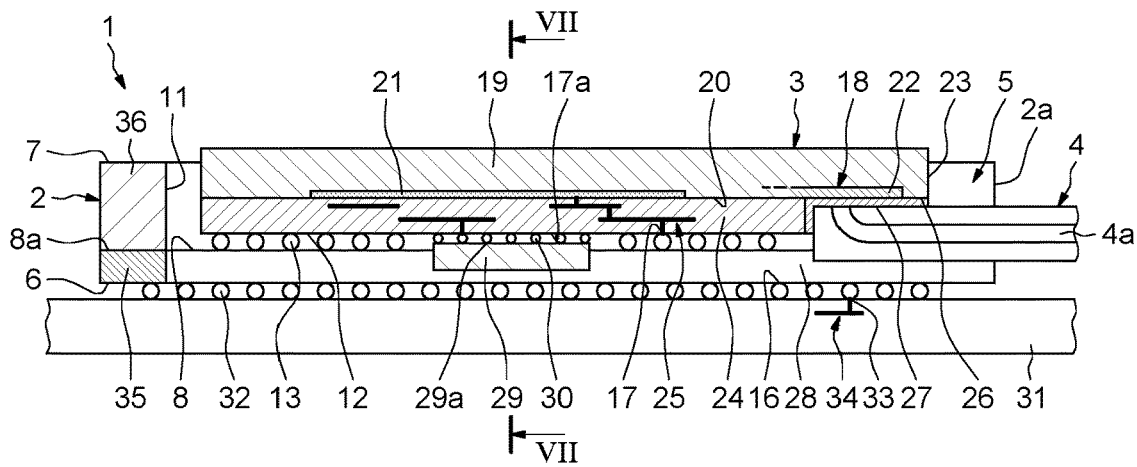
FIG. 6 shows a longitudinal cross section of another electronic device.
Figure 7:
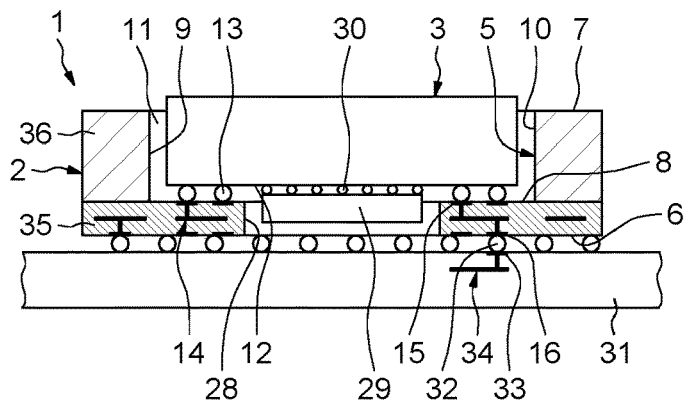
FIG. 7 shows a transverse cross section of the electronic device of FIG. 6, cut along line VII-VII.

FIGS. 6 and 7 illustrate a variant embodiment of the electronic device 1 of FIGS. 1-3, in which the carrier substrate 2 comprises two portions 35 and 36.

The portion 35 is formed by a plate that has a median zone corresponding to the bottom wall 8 of the recess 5 and an exterior zone 8a adjacent to this median zone.

The portion 36 is adhesively bonded to the exterior zone 8a of the portion 35 and forms the opposite lateral walls 9 and 10 of the end wall 11 of the recess 5.

The portion 35 comprises a rigid thin film provided with an electrical connection network 14 and, on one side, pads 15 at the bottom of the recess 5 thus formed and, on the other side, exterior pads 16. The portion 36 is exempt of electrical connections and reinforces the portion 35.

The portion 35 has the through-passage 28 or local passages or channels for receiving the additional chip 29 and for letting the optical cable 4 pass.

According to one variant embodiment (not shown) equivalent to the electronic device 1A illustrated in FIGS. 4 and 5, the portion 35 of the carrier substrate 2 is formed by a thin film with no local passage or no local channel.

Figure 8:
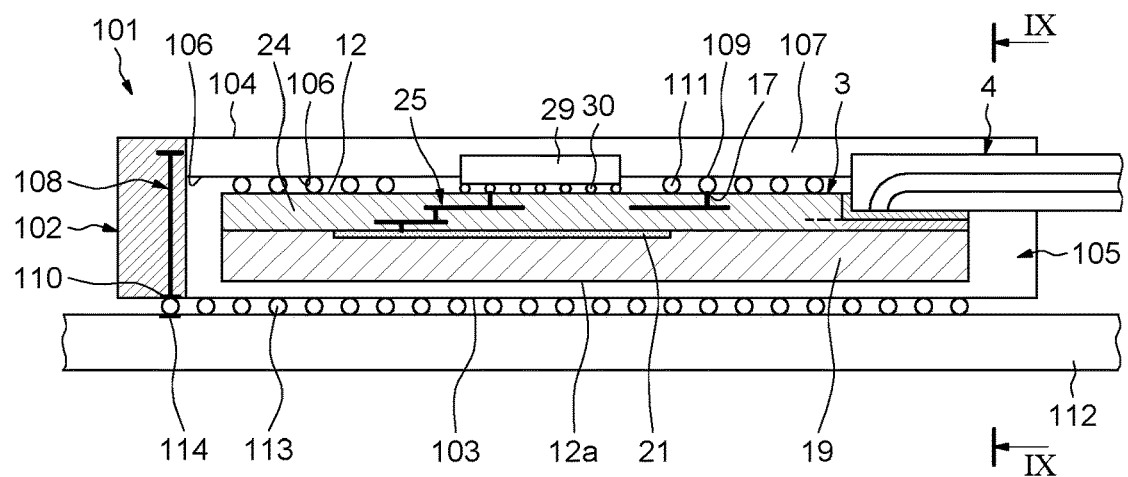
FIG. 8 shows a longitudinal cross section of another electronic device.
Figure 9:
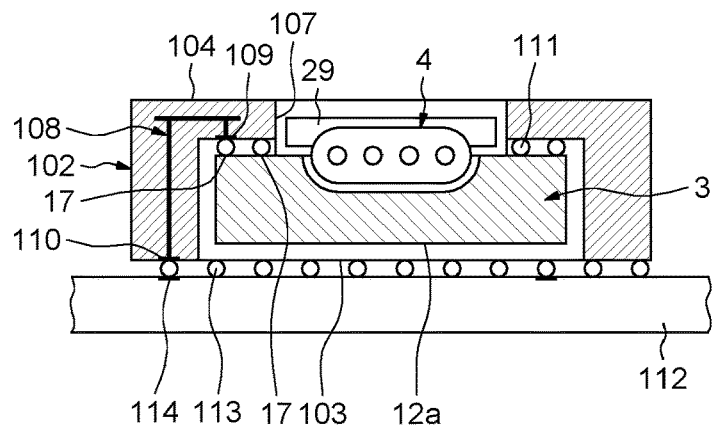
FIG. 9 shows a transverse cross section of the electronic device of FIG. 8, cut along line IX-IX.

FIGS. 8 and 9 illustrate an electronic device 101 that comprises a carrier substrate 102 and, equivalently to the examples described above, an electronic chip 3 equipped with an optical cable 4 and with an additional chip 29.

The carrier substrate 102 is configured to receive the chip 3 and the additional chip 29 and to let the optical cable 4 pass.

The carrier substrate 102 has opposite faces 103 and 104 and has a recess 105 that is formed from face 103 and that has a bottom wall 106.

The carrier substrate 102 has a through-passage (channel) 107 produced in the bottom of the recess 105.

The chip 3 is freely engaged in the recess 105 and the additional chip 29 is freely engaged in the through-passage 107. This arrangement is equivalent to that of the electronic device 1 described above.

The carrier substrate 102 comprises an electrical connection network 108 that comprises electrical connection pads 109 that are produced in the bottom wall 106 and exterior electrical connection pads 110 that are produced in the face 103 adjacent to the recess 105.

The pads 109 are connected to the front pads 17 of the chip 3 by way of electrical connection elements 111. This electrical connection is equivalent to that achieved by the electrical connection elements 13 of the electronic device 1 described above.

Thus, contrary to the examples described above, the connection pads 109 of the chip 3 are on the same side of the carrier substrate 102 as the exterior connection pads 110.

The electronic device 101 is mounted on a printed circuit board 112, face 103 and the recess 105 facing this board 112.

Electrical connection elements 113 are interposed between the exterior pads 110 of face 103 of the carrier substrate 102 and electrical connection pads 114 of the printed circuit board 112.

The depth of the recess 105 may be combined with the thickness of the chip 3 and of the connection elements 111 so that the back face 12a of the chip 3 lies facing and a distance away from the printed circuit board 112. In the contrary case, to decrease the depth of the recess 105, the printed circuit board 112 will have to have a channel or a through-passage suitable for freely receiving the back portion.

Equivalently to the electronic devices of the preceding example embodiments, because of the existence of the recess 105, the thickness of carrier substrate 102 between face 103 and the bottom wall 106 is small, so that the electrical links of the electrical connection network 108, connecting the pads 109 of the bottom wall 106 of the recess 105 and the pads 110 of face 103, are short. Furthermore, the recess 105 allows an electronic device 101 of small thickness and therefore of small bulk to be obtained.

According to one variant embodiment (not shown) of the electronic device 101, the chip 3 could be mounted on the bottom wall 106 of the carrier substrate 102 equivalently to how the electronic device 1A described above is mounted.

In this case, the optical cable 4 and the additional chip 29 are located on the side of the printed circuit board 112 with respect to the carrier substrate 102. As above, to decrease the depth of the recess 105, the printed circuit board 112 may have a channel or a through-passage suitable for freely receiving the additional chip 29 and optionally the back portion of the chip 3 opposite to the bottom wall 106 of the recess 105 and able to let the optical cable 4 pass.

According to one variant embodiment (not shown) of the electronic device 101, the carrier substrate 102 could comprise two adhesively bonded portions equivalent to the adhesively bonded portions 35 and 36 described above, the only difference being that these two portions of the carrier substrate 102 would be provided with two interconnected portions of the electrical connection network 108.

The invention claimed is:

1. An electronic device, comprising:
a carrier substrate including a first network of electrical connections;
a first electronic chip including at least one integrated guide of optical waves and a second network of electrical connections;
an elongate optical cable having an end section mounted flat on one side of the first electronic chip and including at least one longitudinal guide of optical waves that is optically coupled to the integrated guide of optical waves;
wherein the carrier substrate has a recess in which the first electronic chip is at least partially engaged; and electrical connection elements interposed between a face of the first electronic chip and a bottom wall of the recess, said electrical connection elements connected to first connection pads of the first network of electrical connections and second connection pads of the second network of electrical connections;

wherein the carrier substrate comprises two portions:
- a first portion which is formed by a plate having a median zone corresponding to the bottom wall of the recess and an exterior zone adjacent to the median zone; and
- a second portion which is adhesively bonded to the exterior zone of the first portion to form lateral walls of the recess.

2. The device according to claim 1, wherein the first portion of the carrier substrate is provided with the first network of electrical connections.

3. The device according to claim 1, wherein the first and second portions are provided with two connected-together portions of the first network of electrical connections.

4. The device according to claim 1, wherein the carrier substrate is mounted on a printed circuit board, the first network of electrical connections being connected to a third network of electrical connections of the printed circuit board.

5. The device according to claim 1, wherein the carrier substrate is configured to let the elongate optical cable pass.

6. The device according to claim 1, wherein the recess is configured to let the elongate optical cable pass.

7. The device according to claim 1, wherein a face of the carrier substrate which is located on a side opposite to the recess is provided with exterior pads of the first network of electrical connections.

8. The device according to claim 1, wherein a face of the carrier substrate which is located on a side of the recess is provided with exterior pads of the first network of electrical connections.

9. An electronic device, comprising:
- a carrier substrate including a first network of electrical connections;
- a first electronic chip including at least one integrated guide of optical waves and a second network of electrical connections;
- an elongate optical cable having an end section mounted flat on one side of the first electronic chip and including at least one longitudinal guide of optical waves that is optically coupled to the integrated guide of optical waves;
- wherein the carrier substrate has a recess in which the first electronic chip is at least partially engaged; and
- electrical connection elements interposed between a face of the first electronic chip and a bottom wall of the recess, said electrical connection elements connected to first connection pads of the first network of electrical connections and second connection pads of the second network of electrical connections;
- wherein the first electronic chip comprises:
  - a base wafer including said integrated guide of optical waves; and
  - a front layer including the second network of electrical connections;
  - wherein the front layer includes a local groove within which the end section of the elongate optical cable is at least partially engaged, the end section of the elongate optical cable positioned such that the at least one longitudinal guide of optical waves is optically coupled to the integrated guide of optical waves, via a lateral coupling in the zone of said local groove.

10. The device according to claim 9, wherein the elongate optical cable is located on a side of the bottom wall of the carrier substrate with respect to the first electronic chip, wherein a face of the front layer opposite to the base wafer is provided with pads of the second network of electrical connections.

11. The device according to claim 9, wherein the elongate optical cable is located on a side opposite to the bottom wall of the carrier substrate with respect to the first electronic chip, wherein a face of the base wafer opposite the front layer is provided with pads of the second network of electrical connections.

12. The device according to claim 9, comprising a second electronic chip mounted on the front layer of the first electronic chip and connected to the second network of electrical connections.

13. The device according to claim 12, wherein the carrier substrate is configured to receive the second electronic chip.

14. The device according to claim 9, wherein the carrier substrate is mounted on a printed circuit board, the first network of electrical connections being connected to a third network of electrical connections of the printed circuit board.

15. The device according to claim 9, wherein the carrier substrate is configured to let the elongate optical cable pass.

16. The device according to claim 9, wherein the recess is configured to let the elongate optical cable pass.

17. The device according to claim 9, wherein a face of the carrier substrate which is located on a side opposite to the recess is provided with exterior pads of the first network of electrical connections.

18. The device according to claim 9, wherein a face of the carrier substrate which is located on a side of the recess is provided with exterior pads of the first network of electrical connections.

19. The device according to claim 9, wherein the carrier substrate has at least one channel in a bottom of the recess, and at least a portion of the end section of the elongate optical cable is retained within the at least one channel.

20. The device according to claim 19, further comprising a second electronic chip mounted to the first electronic chip and wherein the second electronic chip is retained within the at least one channel.

21. An electronic device, comprising:
- a carrier substrate including a first network of electrical connections;
- a first electronic chip including at least one integrated guide of optical waves and a second network of electrical connections;
- a second electronic chip mounted to the first electronic chip;
- an elongate optical cable having an end section mounted flat on one side of the first electronic chip and including at least one longitudinal guide of optical waves that is optically coupled to the integrated guide of optical waves;
- wherein the carrier substrate has a recess in which the first electronic chip is at least partially engaged;
- wherein the carrier substrate has at least one channel in a bottom wall of the recess;
- wherein at least a portion of the end section of the elongate optical cable is retained within the at least one channel; and wherein the second electronic chip is retained within the at least one channel; and electrical connection elements interposed between a face of the first electronic chip and the bottom wall of the recess, said electrical connection elements connected to first connection pads of the first network of electrical connections and second connection pads of the second network of electrical connections.

22. The device according to claim 21, wherein the carrier substrate is configured to let the elongate optical cable pass.

23. The device according to claim 21, wherein the recess is configured to let the elongate optical cable pass.

24. The device according to claim 21, wherein a face of the carrier substrate which is located on a side opposite to the recess is provided with exterior pads of the first network of electrical connections.

25. The device according to claim 21, wherein a face of the carrier substrate which is located on a side of the recess is provided with exterior pads of the first network of electrical connections.

26. The device according to claim 21, wherein the carrier substrate is mounted on a printed circuit board, the first network of electrical connections being connected to a third network of electrical connections of the printed circuit board.

\* \* \* \* \*